United States Patent
Kim

(10) Patent No.: US 7,846,844 B2
(45) Date of Patent: Dec. 7, 2010

(54) METHOD FOR FABRICATING SADDLE TYPE FIN TRANSISTOR

(75) Inventor: Kwang-Ok Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/574,634

(22) Filed: Oct. 6, 2009

(65) Prior Publication Data

US 2010/0055616 A1  Mar. 4, 2010

Related U.S. Application Data

(62) Division of application No. 11/480,198, filed on Jun. 29, 2006, now abandoned.

(30) Foreign Application Priority Data

Dec. 29, 2005  (KR) .......................... 2005-0133846

(51) Int. Cl.
*H01L 21/311* (2006.01)
(52) U.S. Cl. ................. 438/703; 257/E21.232
(58) Field of Classification Search ................. 438/703; 257/E21.232
See application file for complete search history.

(56) References Cited

U.S. PATENT DOCUMENTS

| 6,211,061 | B1 | 4/2001 | Chen et al. ................. 438/622 |
| 6,326,300 | B1 | 12/2001 | Liu et al. ................. 438/638 |
| 6,956,256 | B2 | 10/2005 | Forbes | |
| 2003/0003756 | A1 | 1/2003 | Yu ................. 438/706 |
| 2004/0009633 | A1 | 1/2004 | Abbott et al. ................. 438/197 |
| 2004/0203238 | A1* | 10/2004 | Moll et al. ................. 438/689 |
| 2005/0214694 | A1 | 9/2005 | Hong et al. ................. 430/323 |
| 2007/0032086 | A1 | 2/2007 | Furukawa et al. ........... 438/706 |

FOREIGN PATENT DOCUMENTS

| KR | 10-2004-0007022 | 1/2004 |
| KR | 10-2005-0027781 | 3/2005 |
| KR | 10-2005-0055978 | 6/2005 |
| KR | 10-2006-0065946 | 6/2006 |

* cited by examiner

*Primary Examiner*—Steven J Fulk
(74) *Attorney, Agent, or Firm*—Blakely, Sokoloff, Taylor & Zafman LLP

(57) ABSTRACT

A method for fabricating a saddle type fin transistor includes: preparing a substrate where a device isolation structure is already formed; forming a hard mask pattern over the substrate, the hard mask pattern including a coating layer obtained through a coating method; and performing an etching process using the hard mask pattern as an etch mask to form a saddle type fin. The hard mask pattern may be formed in a stack structure including an amorphous carbon layer and the coating layer.

8 Claims, 20 Drawing Sheets

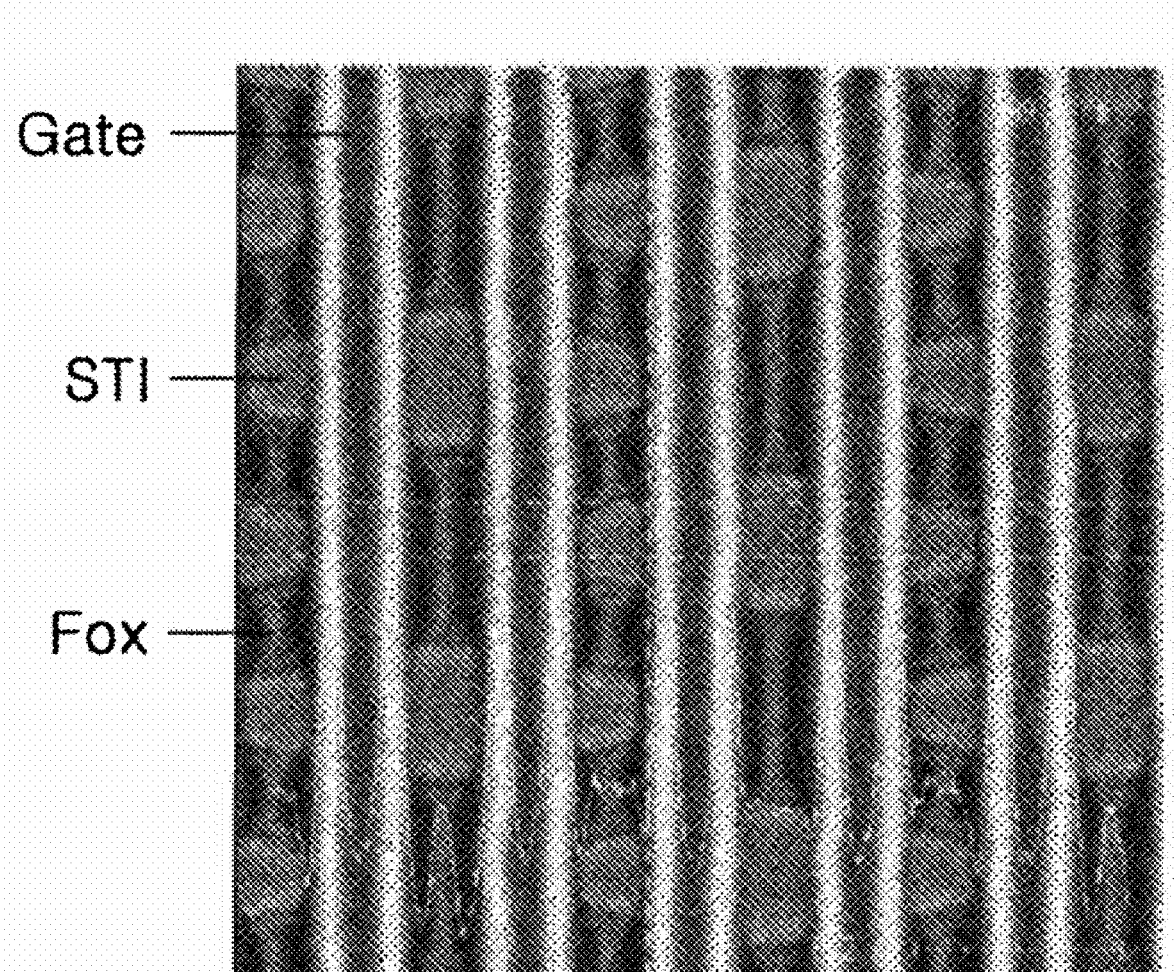

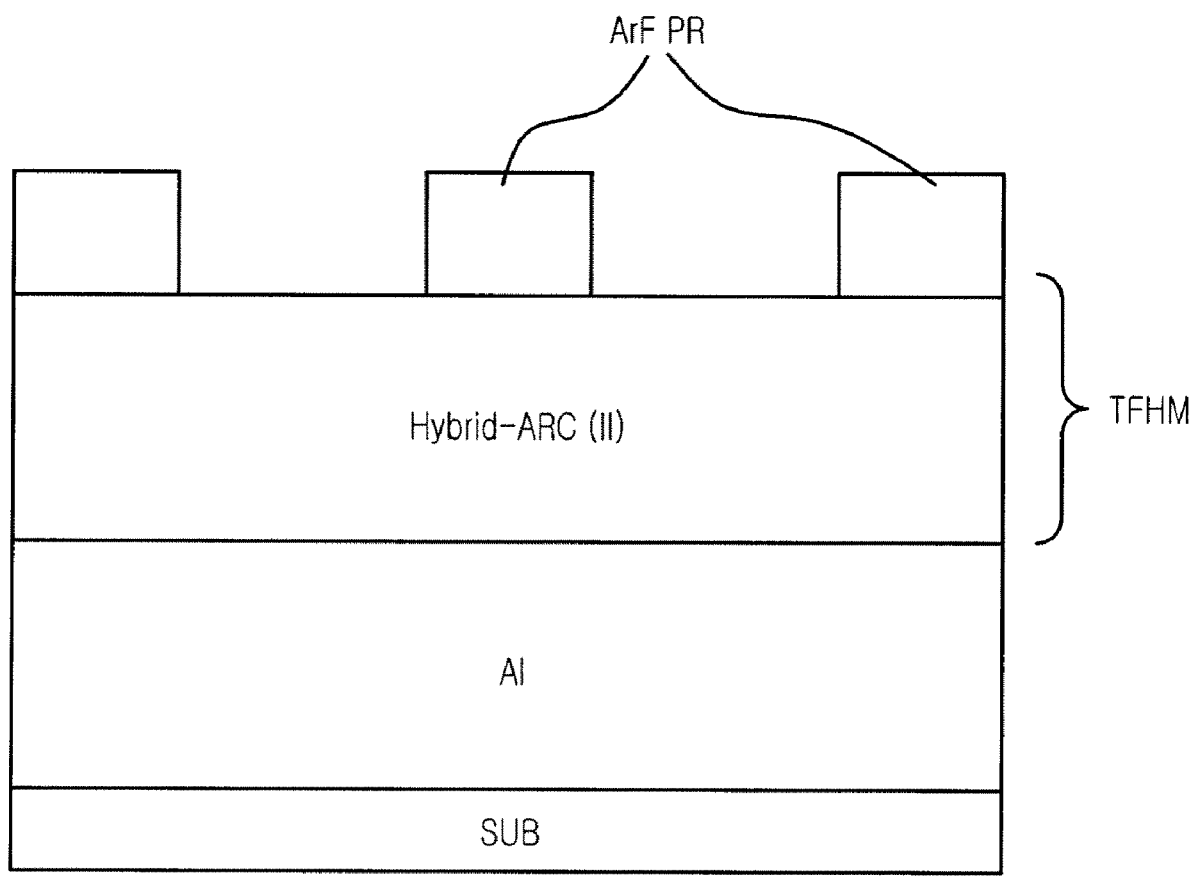

US 7,846,844 B2

METHOD FOR FABRICATING SADDLE TYPE FIN TRANSISTOR

CROSS-REFERENCE TO RELATED APPLICATION

The present patent application is a Divisional of application Ser. No. 11/480,198, filed Jun. 29, 2006 now abandoned.

FIELD OF THE INVENTION

The present invention relates to a method for fabricating a semiconductor device; and more particularly, to a method for fabricating a saddle type fin transistor having characteristics of a fin transistor and a recess transistor.

DESCRIPTION OF RELATED ARTS

Generally, transistors having horizontal channels that are most widely used often have disadvantages associated with a current trend in the large-scale of device minimization and integration. Thus, the minimization of such transistors becomes limited. The minimized horizontal channels of the transistors may have disadvantages such as a short channel effect and a drain induced barrier lower (DIBL) effect, usually caused by a shortened channel length. If the channel length is decreased to 50 nm or less, process variations increase, resulting in scattered device characteristics. If the channel length is decreased to 30 nm or less, the short channel effect and the DIBL effect become severe, often disabling a normal device operation. Therefore, a dual gate transistor is suggested to overcome the above mentioned disadvantages. In general, the dual gate transistor has a structure including channels and gates that surround the channels or are disposed in both sides of the channels.

For the transistors having the horizontal channels, the gate electrodes are formed on the horizontal channels. Thus, an electric field that has an upward/downward unbalance is more likely to be applied to the horizontal channels, and as a result, controlling an on/off operation of the transistors is generally difficult due to the gate electrodes. As the channel size decreases, the short channel effect becomes pronounced. On the contrary, gate electrodes of dual gate transistors having vertical channels are commonly formed in both sides of the thin channels. Thus, the gate electrodes generally affect the entire channel regions. When the transistors are turned off, a current flow can be controlled between a source and a drain. As a result, power consumption can be reduced, and the on/off operation can be controlled effectively.

Fin transistors are one example of the transistors having the vertical channels. FIG. 1 illustrates a typical fin transistor 10. The fin transistor 10 includes a fin structure where a fin 2 (i.e., an upper portion of a substrate 1) is formed between device isolation regions 3. Reference numeral 4 denotes a gate electrode. Both sides of the fin 2 can serve as channels, thereby increasing the channel area. As a result, the short channel effect can be reduced. However, this fin structure is generally limited to increase an effective channel length despite the reduction in a body effect.

Another example of the transistors having the vertical channels is a recess transistor 20 (or a trench transistor) illustrated in FIG. 2. The recess transistor 20 includes a substrate 11, device isolation regions 13, a gate insulation layer 12, and a recess gate electrode 14. Different from the fin transistor 10, the recess transistor 20 has a structure that determines a threshold voltage regardless of the gate length. The recess transistor 20 may have a limitation in that the threshold voltage may be lowered. Also, the recess transistor 20 may not be free from the short channel effect like the fin transistor 10.

FIG. 3 illustrates cross-sectional views of various types of typical transistors. A saddle type fin transistor has a combined structure of the fin transistor and the recess transistor. The saddle type fin transistor utilizes the advantages of the recess transistor, and is beneficial to the low threshold voltage and the shortened effective channel length, which often arise when using the fin transistor. Thus, in a dynamic random access memory (DRAM), using the saddle type fin transistor is much advantageous in respect of device operation characteristics than using the fin transistor.

FIG. 4 illustrates a top view of a typical saddle type fin transistor structure. FIG. 5 illustrates an enlarged perspective view of a portion 'A' illustrated in FIG. 4. FIGS. 6A and 6B illustrate cross-sectional views of the typical saddle type fin transistor cut along lines I-I' and II-II' of FIG. 5, respectively. FIGS. 7A to 7F illustrate perspective views of the typical saddle type fin transistor illustrated in FIG. 5 to describe a method for fabricating the same. Since FIGS. 7A to 7F show the typical saddle type fin transistor structure including the elements illustrated in FIGS. 4, 5, 6A and 6B, detail description of the illustrated elements in FIGS. 4, 5 and 6A and 6B will be omitted for the simplicity.

Referring to FIG. 7A, although not illustrated, a pad oxide layer and a pad nitride layer are formed sequentially on a bulk substrate 110, which is generally cheaper than a silicon-on-insulator (SOI) substrate. A shallow trench isolation (STI) process is performed to form trenches in the substrate 110.

A high density plasma layer having a good gap-filling property is formed to fill the trenches. A chemical mechanical polishing (CMP) process is performed thereon to planarize the high density layer. As a result, a device isolation structure 111 defining an active region and a field region is formed. A wall oxide layer may be formed on the inner surface of the trenches where the device isolation structure 111 is formed. The wall oxide layer is formed using an oxidation treatment, which also rounds the inner surface of the trenches.

An amorphous carbon layer 112A, a silicon oxynitride (SiON) layer 112B and an anti-reflective coating layer 113 are formed sequentially on the above resulting structure. A photoresist pattern 114 is formed on the anti-reflective coating layer 113 using a photolithography process. The anti-reflective coating layer 113 is a bottom anti-reflective coating layer and, is formed of an organic or inorganic material. The amorphous carbon layer 112A and the SiON layer 112B serve as a hard mask.

Referring to FIG. 7B, the anti-reflective coating layer 113, the SiON layer 112B and the amorphous carbon layer 112A are etched using the photoresist pattern 114 as an etch mask to obtain a hard mask pattern 112 including a patterned amorphous carbon layer 112A' and a patterned SiON layer 112B'. The photoresist pattern 114 is stripped away. At this time, the anti-reflective coating layer 113 is also removed. However, as illustrated, the anti-reflective coating layer 113 may remain on the hard mask pattern 112. Reference numeral 113A denotes the remaining anti-reflective coating layer. The formation of the above described hard mask pattern 112 will be described in FIG. 8 in detail.

Referring to FIG. 7C, an etching process is performed using the hard mask pattern 112 as an etch mask to form a saddle type fin 115. The etching process is performed in a condition that an etch selectivity between the substrate 110 (e.g., the silicon substrate) and the device isolation structure 111 is maximum. Due to this condition, the device isolation structure 111 is etched, and the substrate 110 thereafter, or the substrate 110 is etched, and then the device isolation structure 111. Reference numeral 111A represents a patterned device isolation structure. Using the hard mask pattern 112 including the patterned amorphous carbon layer 112A' as a fin mask can reduce a critical dimension (CD) of the saddle type fin 115. As a result, device characteristics can be improved. The CD of the saddle type fin 115 can be reduced because the amorphous carbon layer 112A has a higher etch selectivity to a bottom structure than the photoresist pattern 114 due to material properties of the amorphous carbon layer 112A.

Referring to FIG. 7D, the hard mask pattern 112 is removed via an etching process. Referring to FIG. 7E, a gate oxidation process is performed to form a gate oxide layer 115 on an exposed portion of the substrate 110. Referring to FIG. 7F, a polysilicon layer 116 and a conductive layer 117 are sequentially formed to cover the saddle type fin 115. The polysilicon layer 116 and the conductive layer 117 function as a gate. The conductive layer 117 is formed of a material such as tungsten, tungsten silicide, or a combination thereof.

As described above, the amorphous carbon layer 112A is used as a hard mask material for forming the saddle type fin 115. Thus, when the field region and the active region (i.e., the device isolation structure 111 and the substrate 110) have different heights, those layers for forming the hard mask pattern 112 are formed over the device isolation structure 111 and the substrate 110 with different heights. Detail description of this step coverage characteristic of the hard mask pattern 112 comprising amorphous carbon, will be provided in FIG. 8.

FIG. 8 illustrates a detail cross-sectional view of a typical saddle type fin transistor structure to describe the hard mask pattern formation. When a pad nitride layer is removed, the height of a device isolation structure 111 (i.e., the field region) becomes different from that of the substrate 110 (i.e., the active region 103). Thus, an amorphous carbon layer 112A and a SiON layer 112B formed thereon also have different heights depending on the position on the active region 103 and the device isolation structure 111. As a result, the anti-reflective coating layer 113 is also formed to have a different height because the anti-reflective coating layer 113 flows when a photolithography process is performed to form a photoresist pattern 114. When the anti-reflective coating layer 113 having a regionally different height is etched, a final inspection critical dimension (FICD) of a target structure becomes different depending on the height of the anti-reflective coating layer 113. Reference numeral 102 represents the aforementioned wall oxide layer.

FIGS. 9A and 9B illustrate this limitation associated with the regionally different height of an anti-reflective coating layer. FIGS. 10A and 10B illustrate a change in FICD of a target structure depending on the height of an anti-reflective coating layer. Particularly, FIG. 10A illustrates a micrographic scanning electron microscopy (SEM) image of a target structure after an etching process for forming a saddle type fin. FIG. 10B illustrates a micrographic SEM image of a target structure after an etching process for forming gates. Table 1 below provide the exemplary data supporting the change in the FICD of the target structure depending on the height of the anti-reflective coating layer illustrated in FIGS. 10A and 10B.

TABLE 1

|  | S-fin (Saddle type): FIG. 10A | Split: FIG. 10B |
| --- | --- | --- |
| Height of anti-reflective coating | 250 Å | 450 Å |

TABLE 1-continued

|  | S-fin (Saddle type): FIG. 10A | Split: FIG. 10B |
| --- | --- | --- |
| layer FICD | 52 nm | 76 nm |

As the saddle type fin (S-fin) has a large height difference, the FICD thereof becomes increased. As a result, as illustrated in FIG. 10B, a device isolation structure Fox has an increased CD. Thus, it may be difficult to achieve an overlap between the device isolation structure Fox and the corresponding gate Gate. This difficulty may result in generation of bridges between the gates, or leakage current during formation of contacts, thereby degrading device characteristics.

SUMMARY OF THE INVENTION

It is, therefore, an object of the present invention to provide a method for fabricating a saddle type fin transistor advantageous of improving a device characteristic by reducing an increase of a FICD of a target structure, usually caused by a height difference between an active region and a field region.

In accordance with an aspect of the present invention, there is provided a method for fabricating a saddle type fin transistor, including: preparing a substrate where a device isolation structure is already formed; forming a hard mask pattern over the substrate, the hard mask pattern including a coating layer obtained through a coating method; and performing an etching process using the hard mask pattern as an etch mask to form a saddle type fin.

BRIEF DESCRIPTION OF THE DRAWINGS

The above and other objects and features of the present invention will become better understood with respect to the following description of the exemplary embodiments given in conjunction with the accompanying drawings, in which:

FIGS. 10A and 10B illustrate respective micrographic SEM images of a typical saddle type fin and a gate after corresponding etching processes to show a change in FICD of a typical saddle type fin or gate;

FIGS. 12 and 13 illustrate cross-sectional views of exemplary multi-film hard masks (MFHMs) illustrated in FIG. 11.

DETAILED DESCRIPTION OF THE INVENTION

Figure 1:
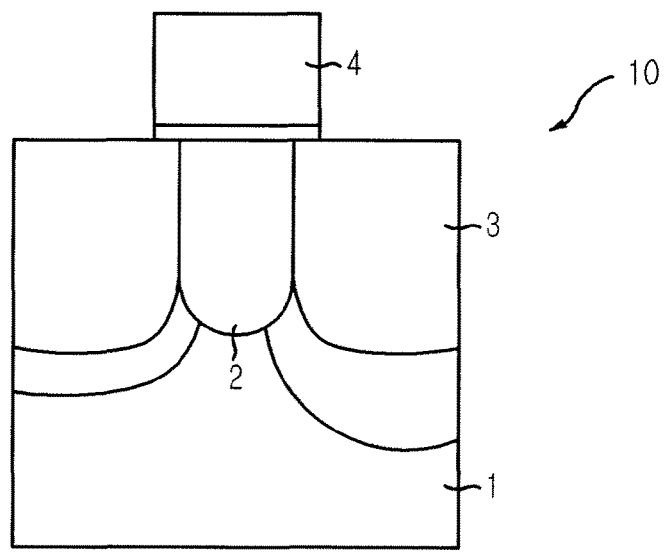
FIG. 1 illustrates a simplified cross-sectional view of a typical fin transistor.
Figure 2:
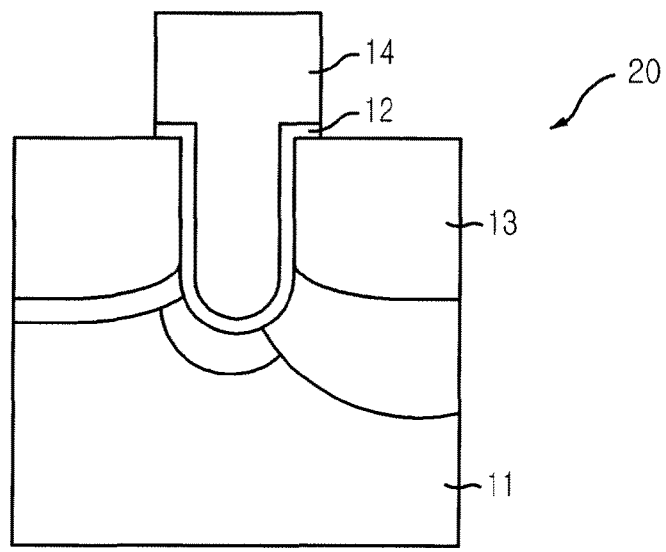
FIG. 2 illustrates a simplified cross-sectional view of a recess transistor.
Figure 3:
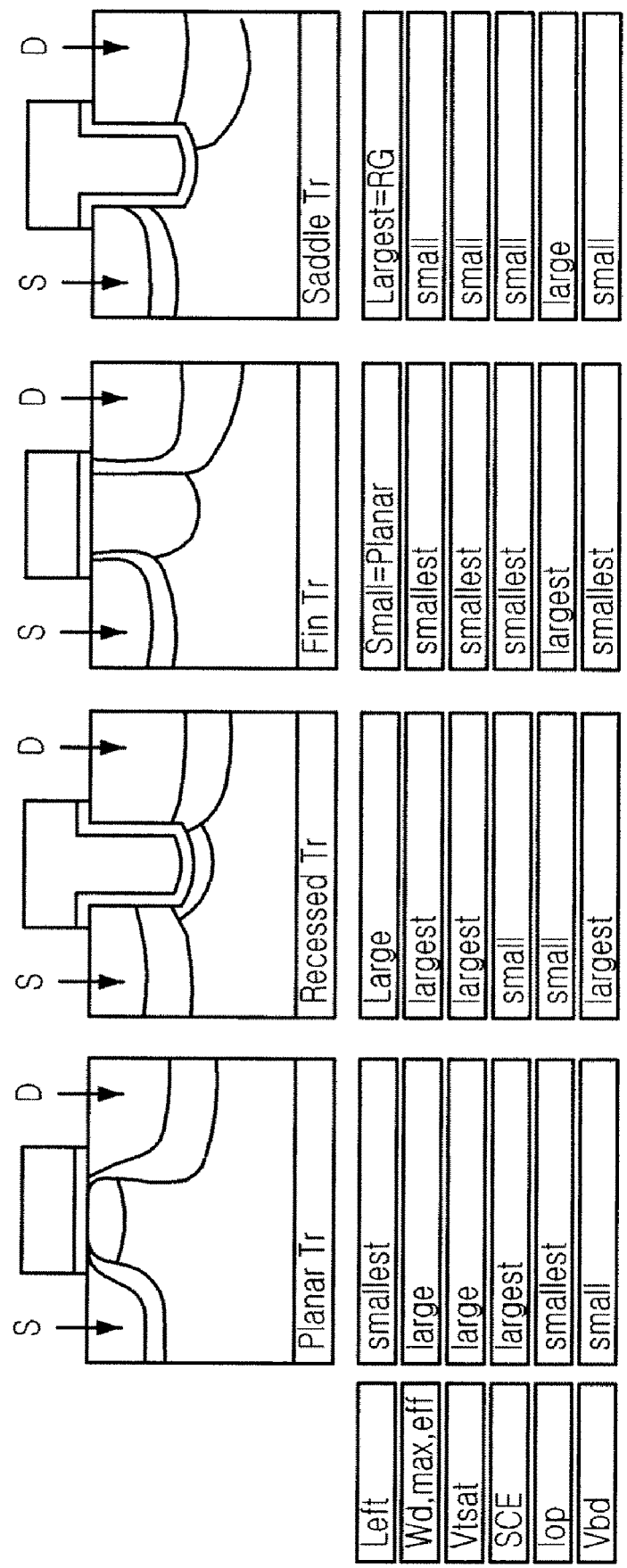
FIG. 3 illustrates simplified cross-sectional views of various types of typical transistors.
Figure 4:
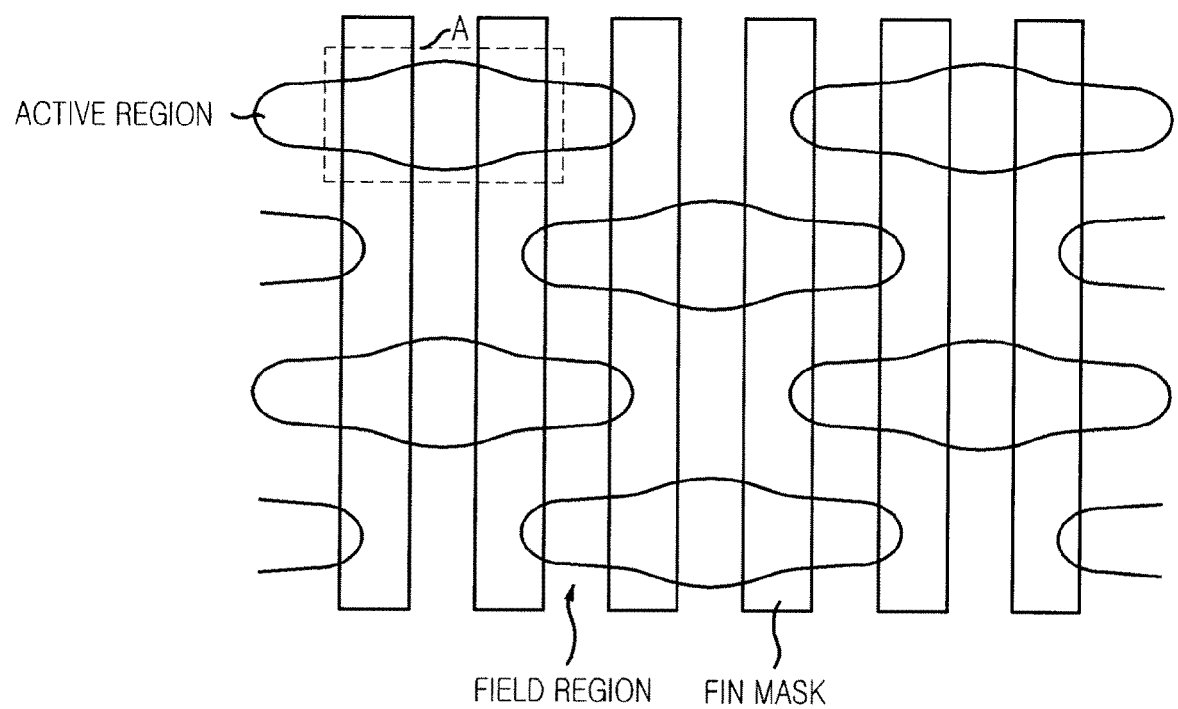
FIG. 4 illustrates a top view of a typical saddle type fin transistor.
Figure 5:
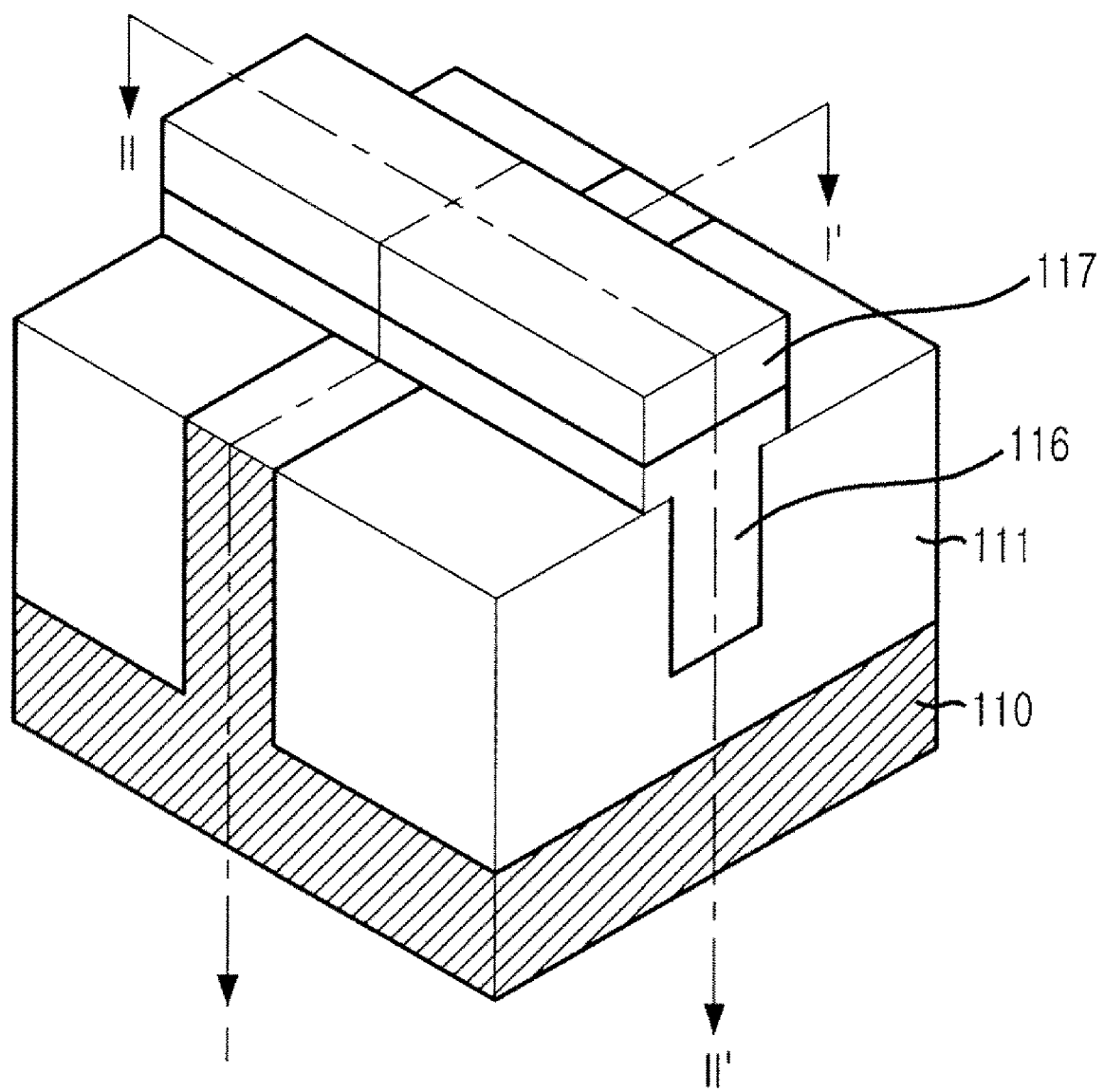
FIG. 5 illustrates an enlarged perspective view of a portion 'A' illustrated in FIG. 4.
Figure 6A:
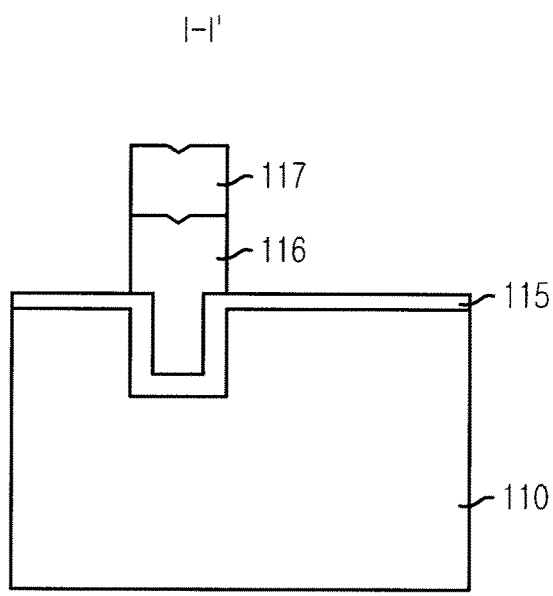
FIG. 6A illustrates a cross-sectional view of the typical saddle type fin transistor cut along a line I-I' of FIG. 5.
Figure 6B:
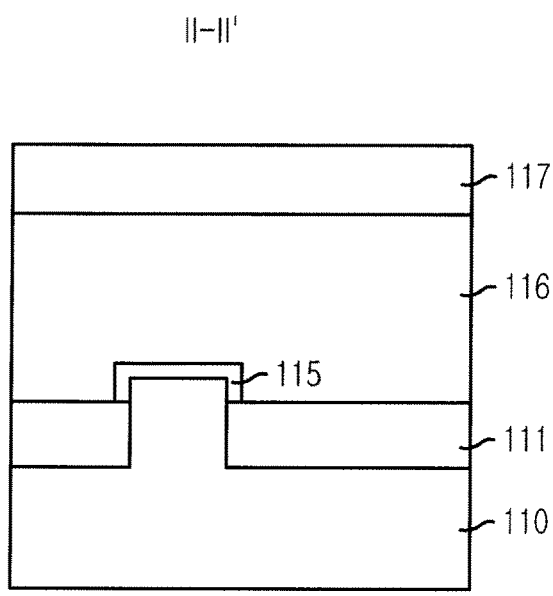
FIG. 6B illustrates a cross-sectional view of the typical saddle type fin transistor cut along II-II' of FIG. 5.
Figure 7A:
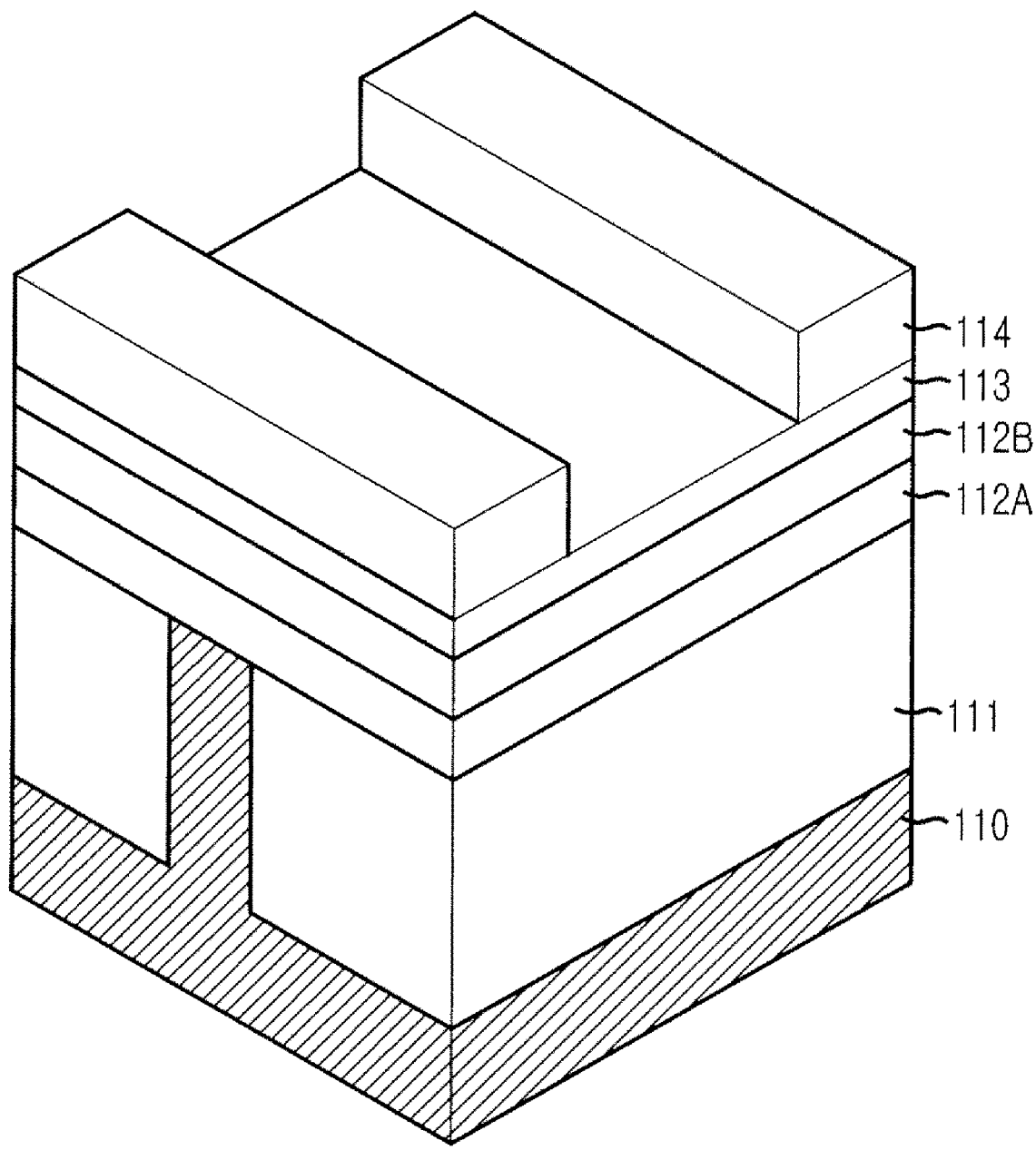
FIGS. 7A to 7F illustrate simplified cross-sectional views of the saddle type fin transistor illustrated in FIG. 5 to describe a method for fabricating the same.
Figure 7B:
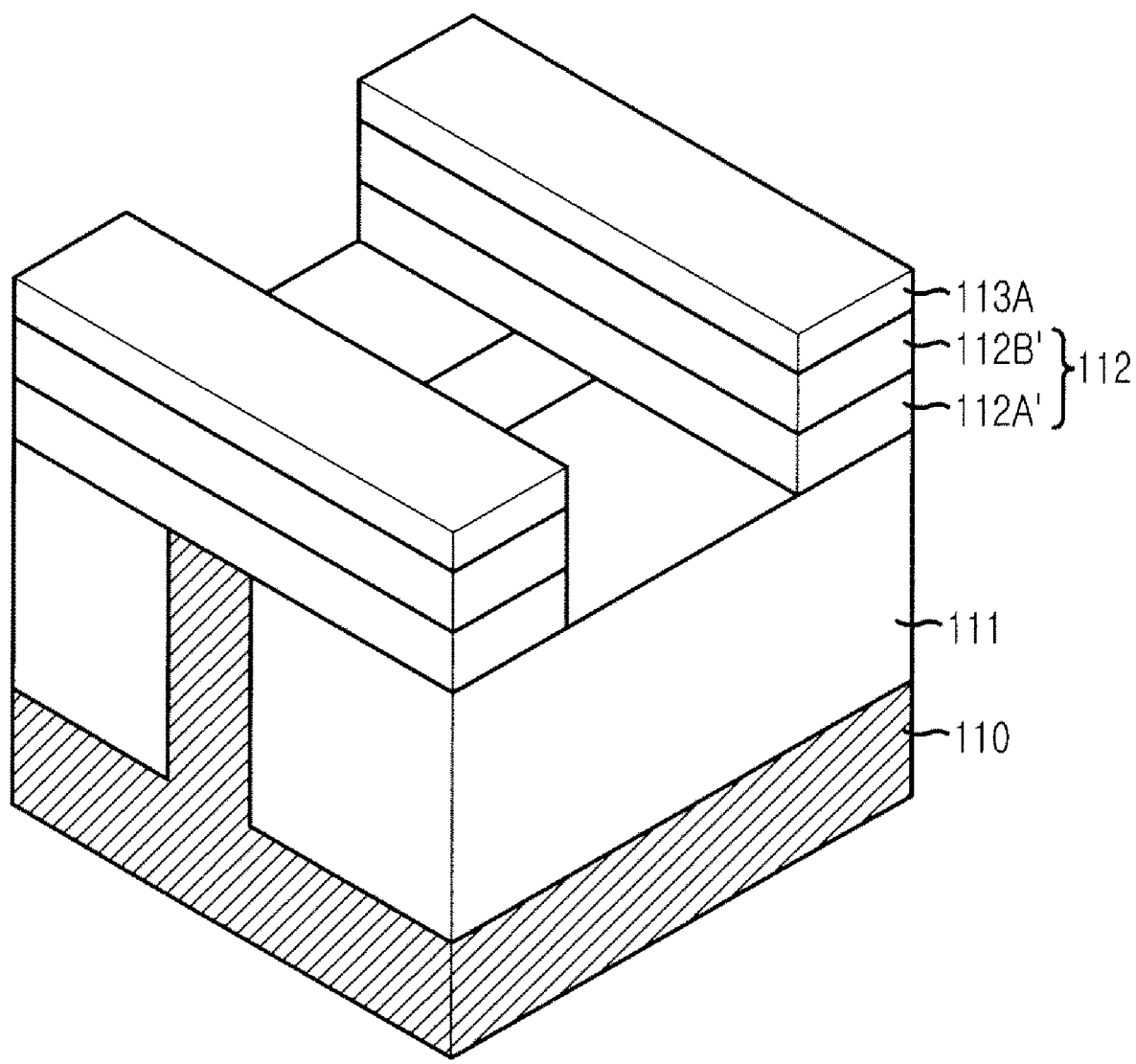
Figure 7C:
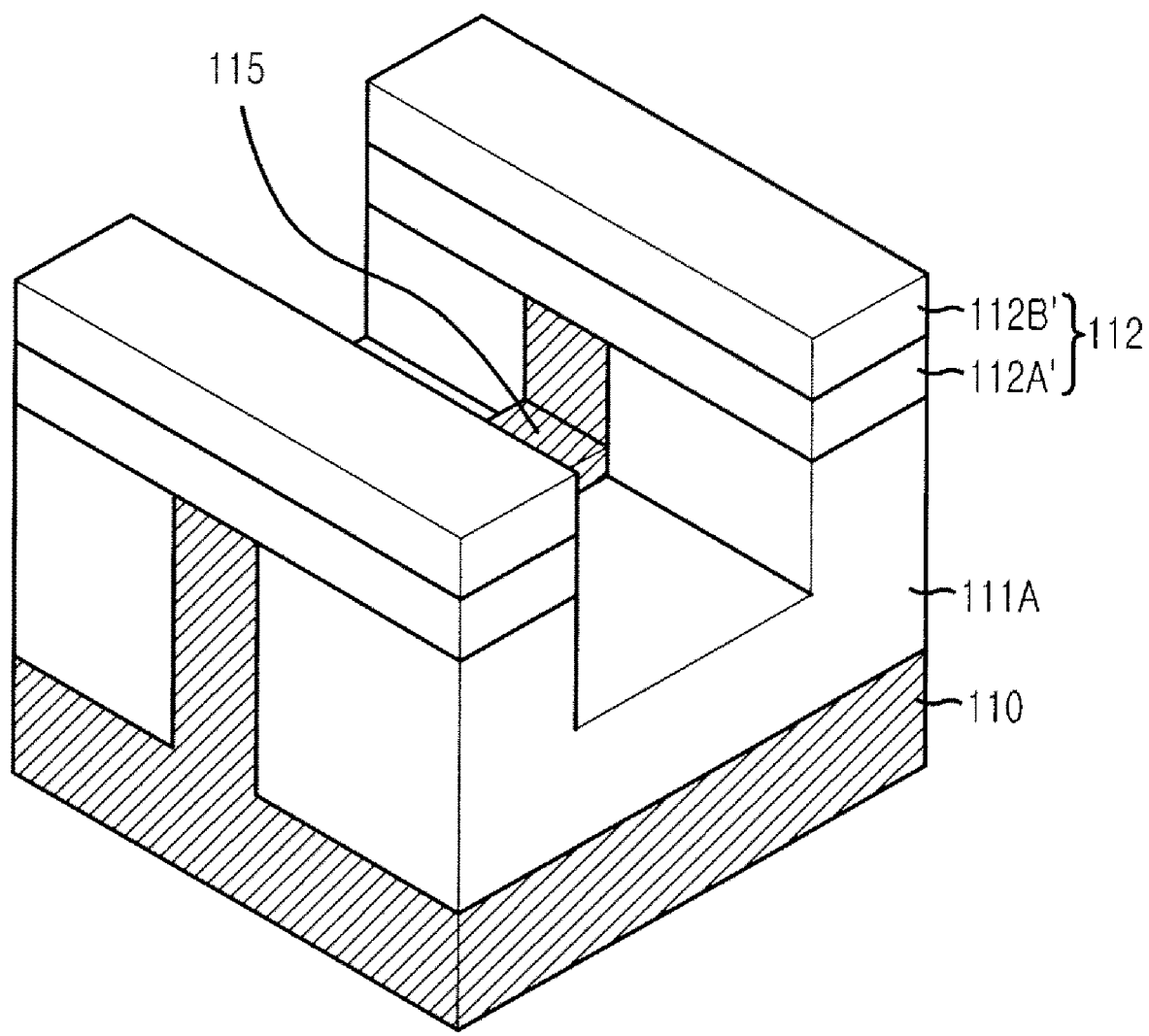
Figure 7D:
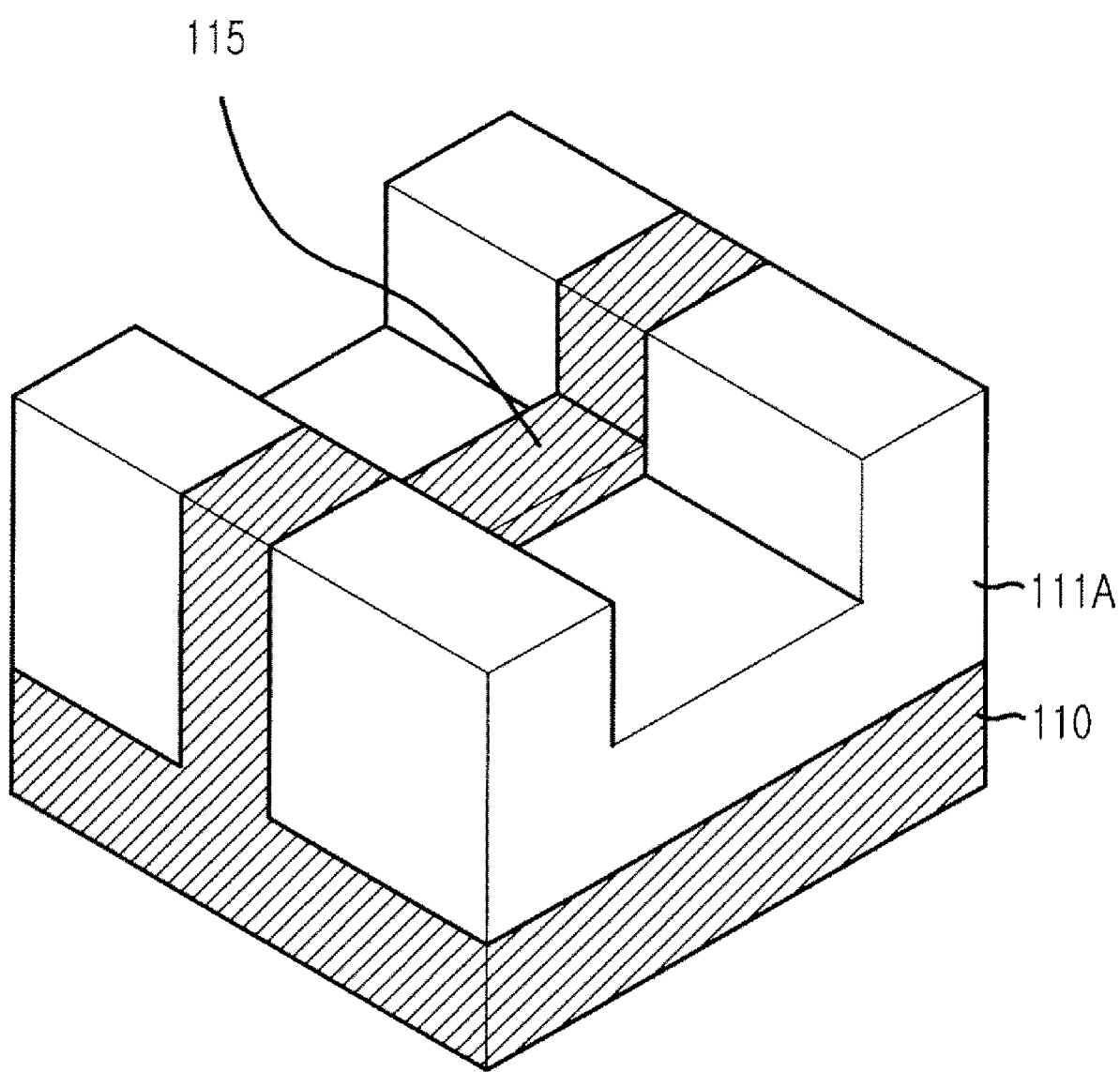
Figure 7E:
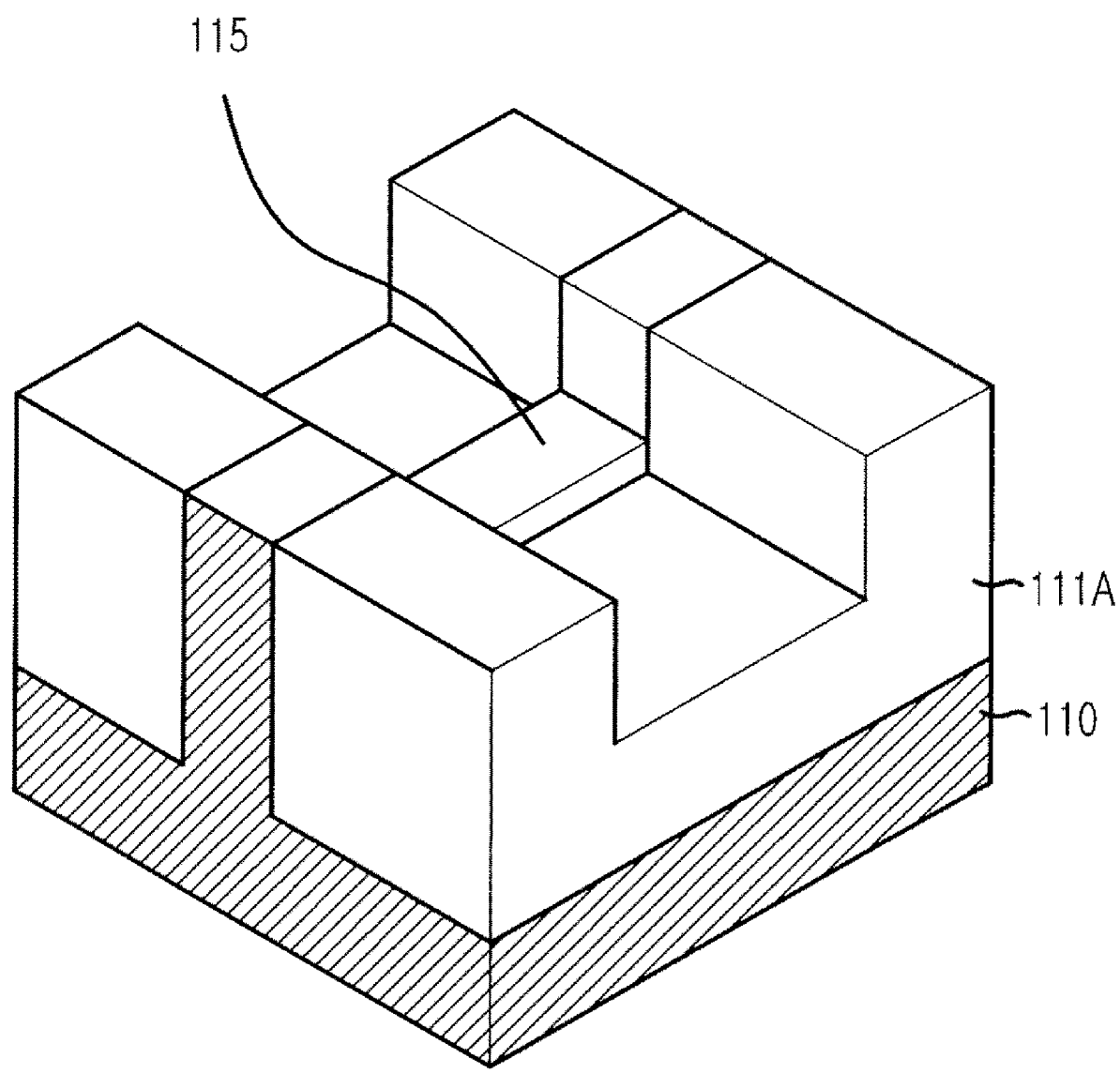
Figure 7F:
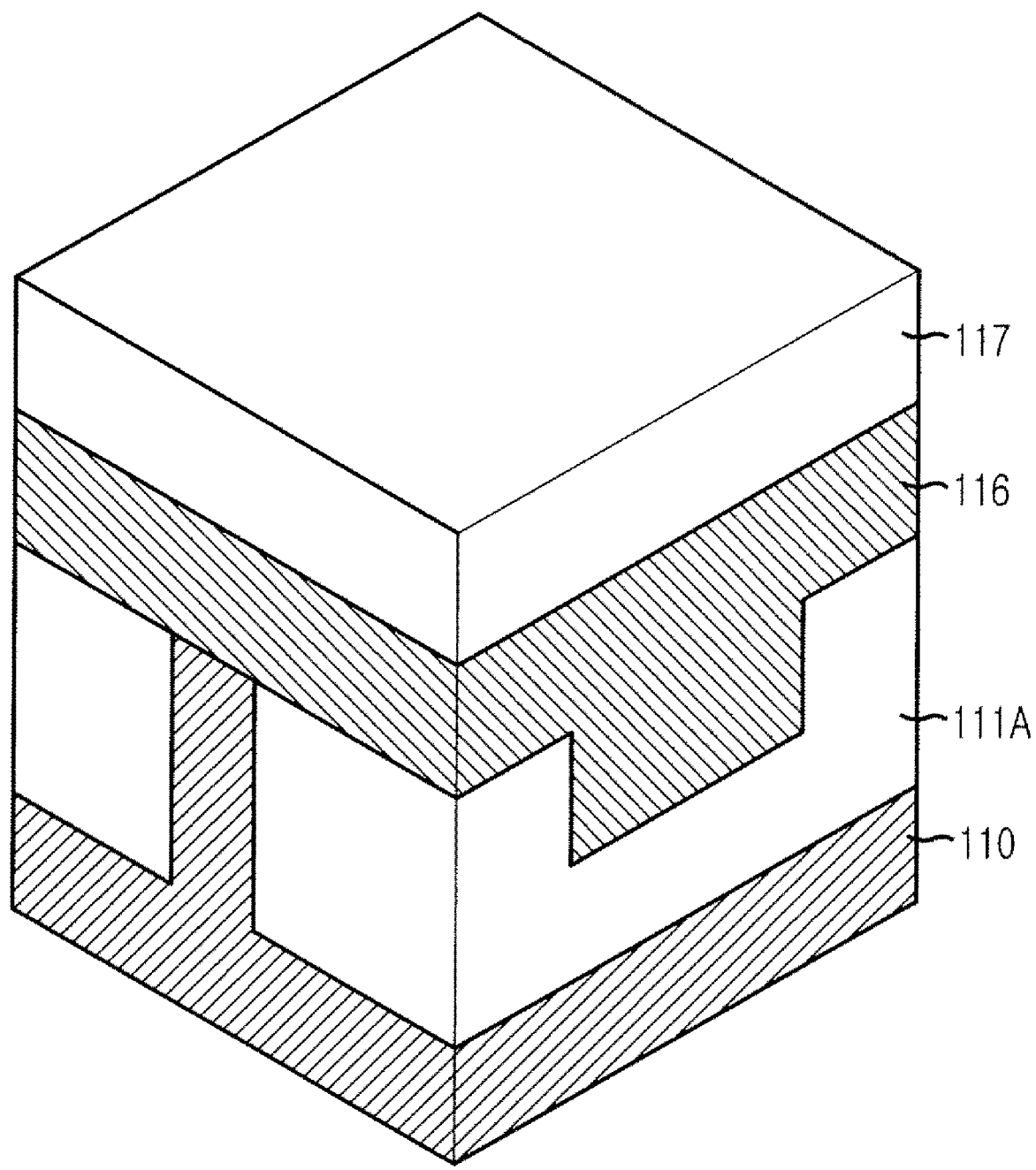

A method for fabricating a saddle type fin transistor in accordance with exemplary embodiments of the present invention will be described in detail with reference to the accompanying drawings. In the drawings, the thickness of layers and regions are exaggerated for clarity. If it is stated that a layer is formed "on" another layer or on a substrate, it should be construed that the layer is formed directly on the other layer or on the substrate, or a third layer may be interposed therebetween. Also, like reference numerals denote like elements even in different drawings.

Figure 8:
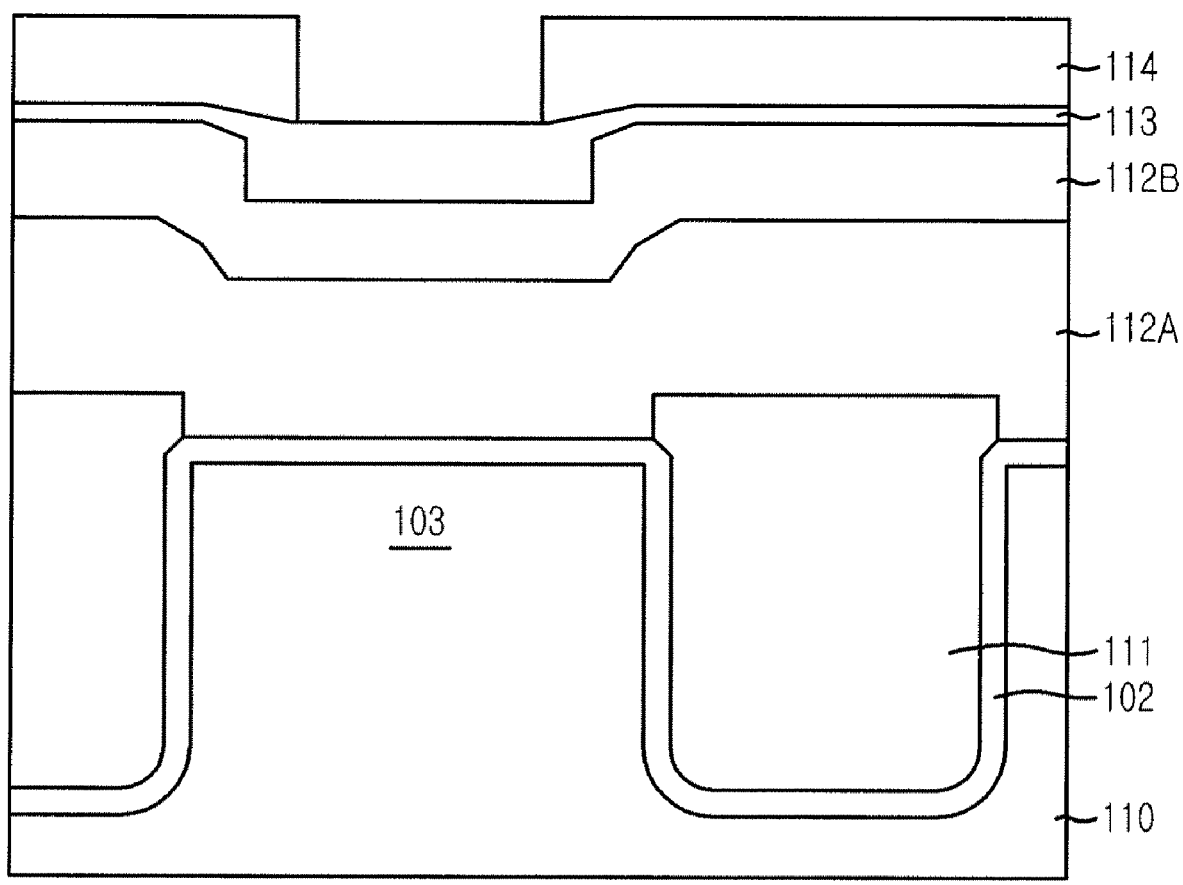
FIG. 8 illustrates a cross-sectional view of a typical saddle type fin transistor.
Figure 9A:
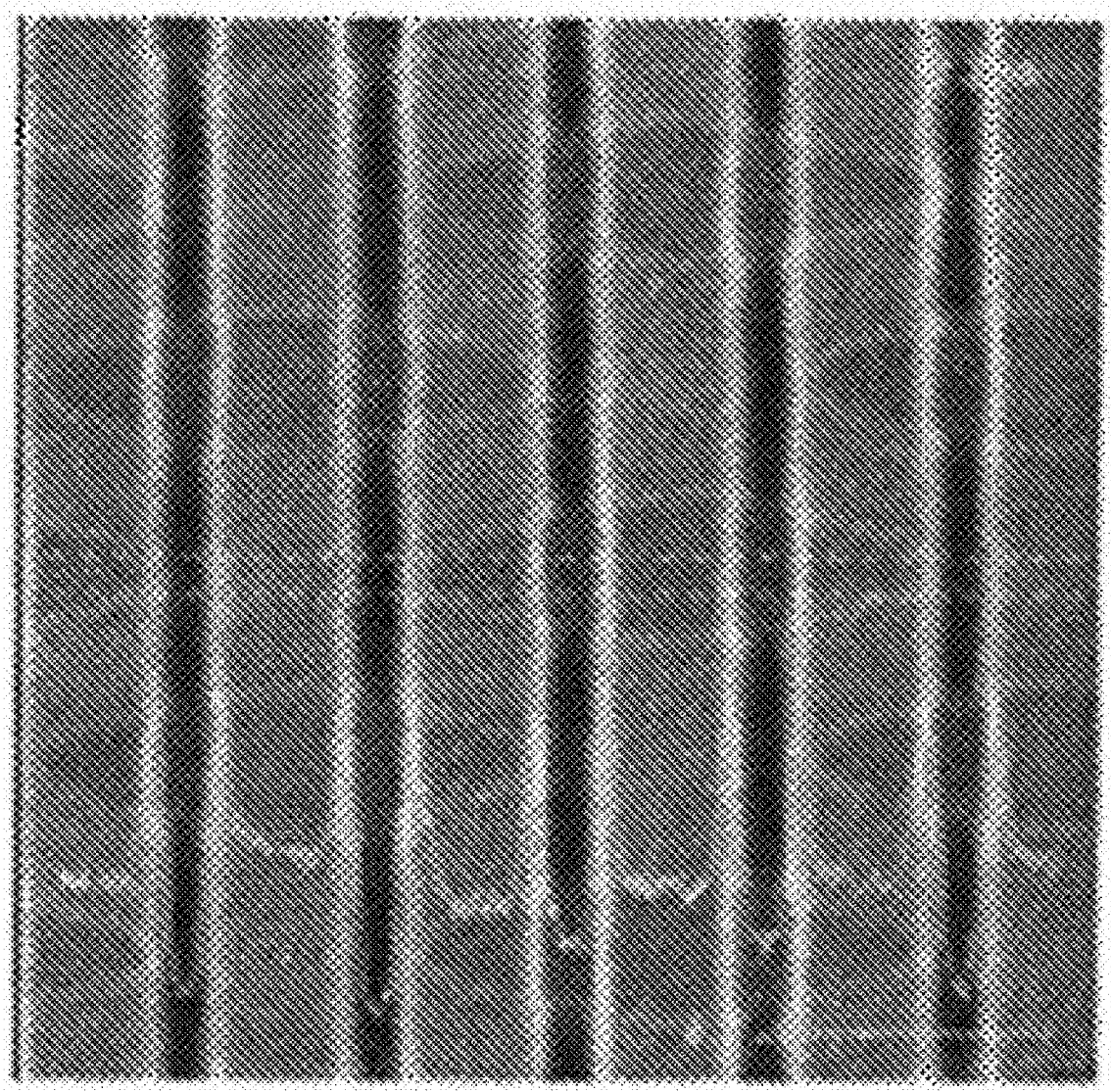
FIGS. 9A and 9B are micrographic SEM images illustrating a change in FICD of a typical saddle type fin or gate obtained through the typical fabrication method of the saddle type fin transistor.
Figure 9B:
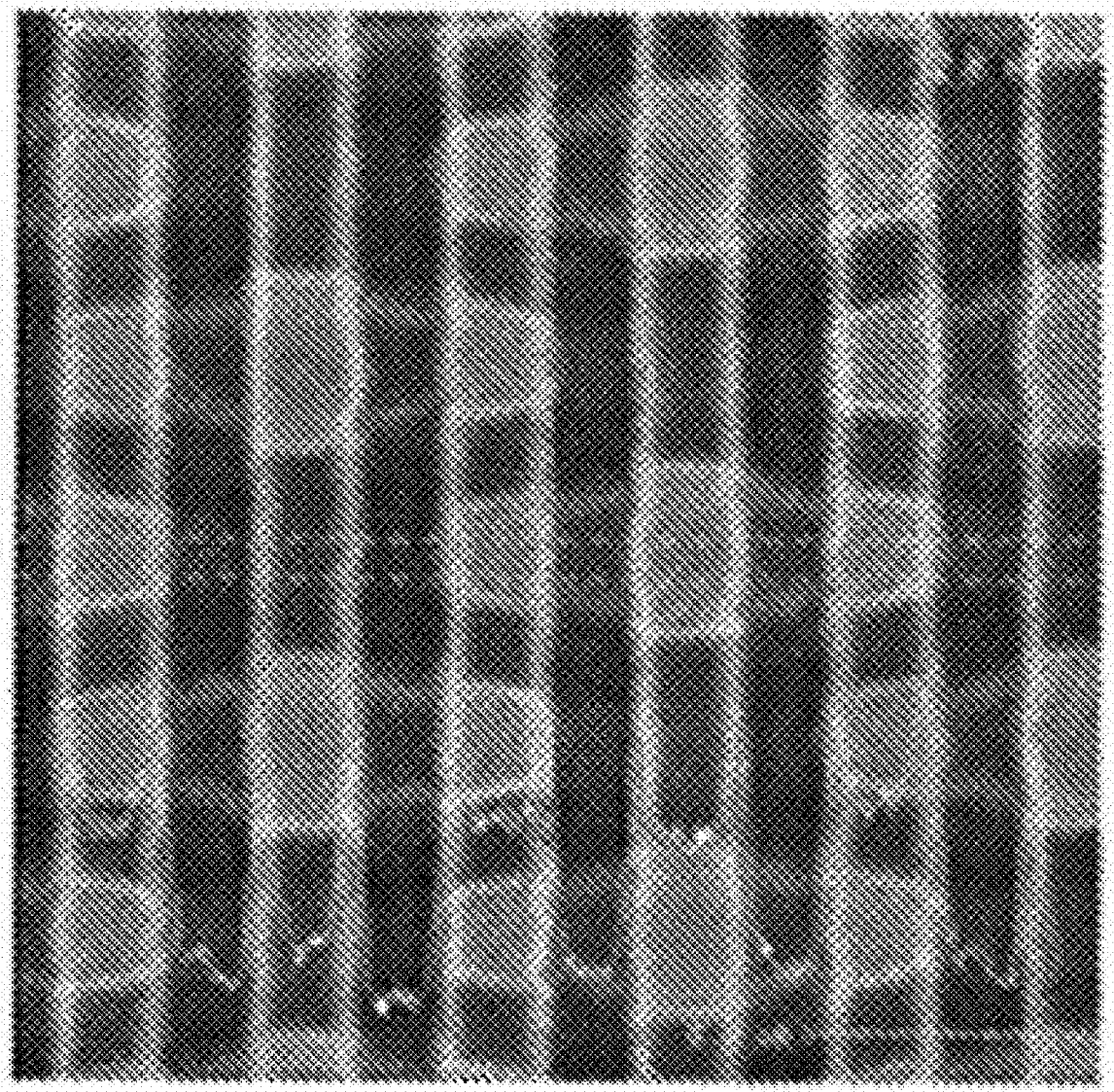
Figure 10A:
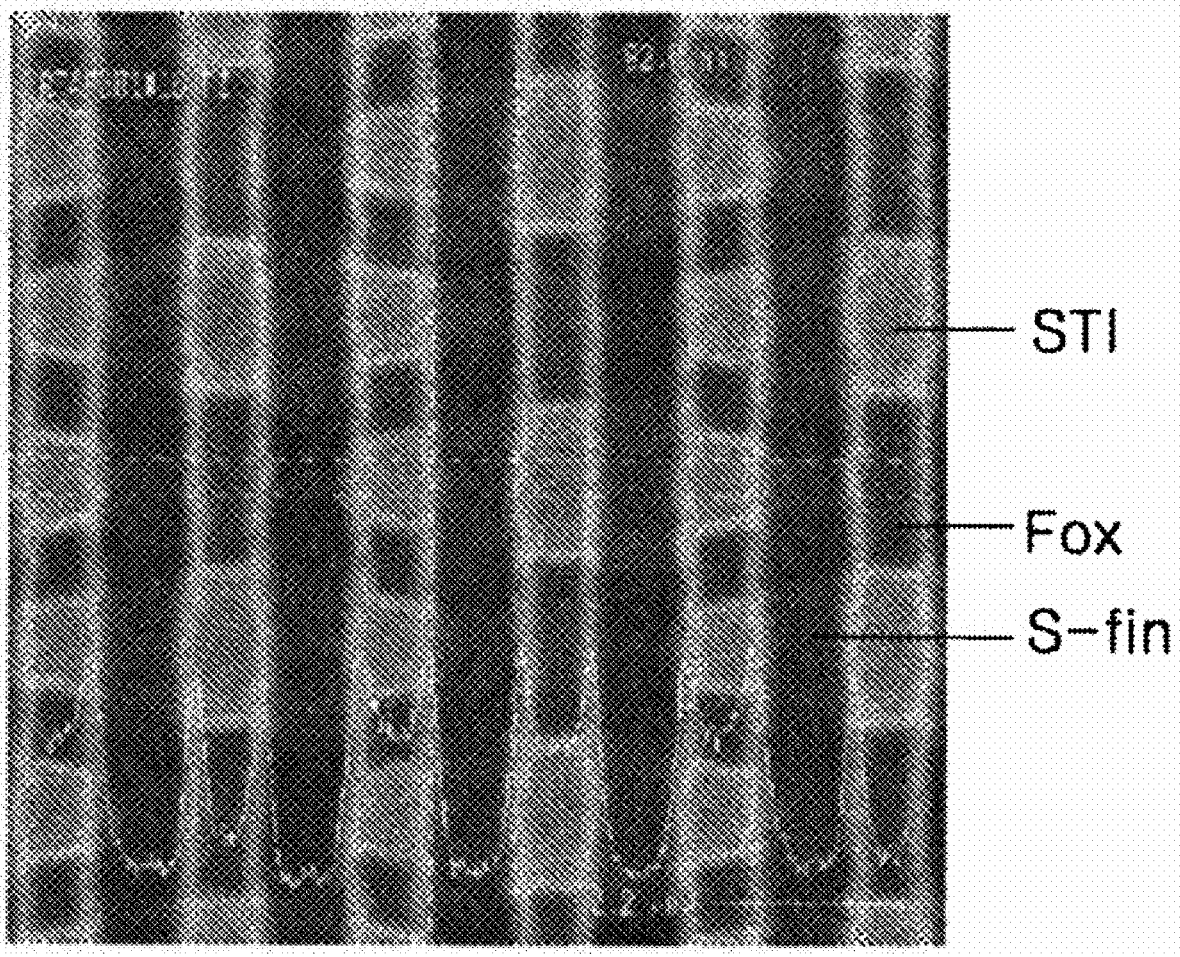
Figure 11:
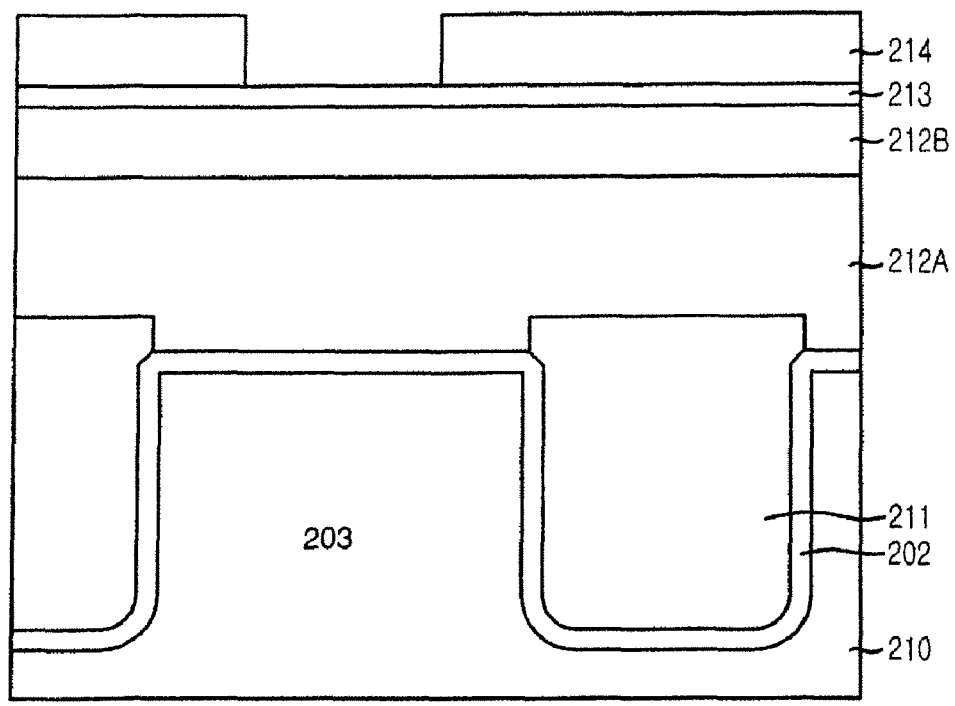
FIG. 11 illustrates a simplified cross-sectional view of a saddle type fin transistor in accordance with an embodiment of the present invention to illustrate a method for fabricating the same.

FIG. 11 illustrates a simplified cross-sectional view of a saddle type fin transistor in accordance with an embodiment of the present invention to illustrate a method for fabricating the same. The saddle type fin transistor of FIG. 11 corresponds to that of FIG. 8.

Instead of using the amorphous carbon layer 112A as a hard mask pattern (refer to FIG. 8), the saddle type fin transistor is fabricated using an MFHM layer 212A as a hard mask according to the embodiment of the present invention. Different from a typical deposition method for the amorphous carbon layer, the MFHM layer 212A includes all types of coating layers obtained via any coating method. The MFHM layer 212A can be coated over a target structure, flowing evenly. As a result, the MFHM layer 212A can be formed with the even height even though a bottom structure has different heights depending on the position. For the even height of the MFHM layer 212A (i.e., the planarized MFHM layer 212A), the MFHM layer 212A is formed to a height larger than a height difference between an active region 203 and a field region (i.e., the device isolation structure 211). The MFHM layer 212A may include a bifunctional hard mask (BFHM) layer or trifunctional hard mask (TFHM) layer. A SiON layer 212B may also be used as a hard mask.

Figure 12:
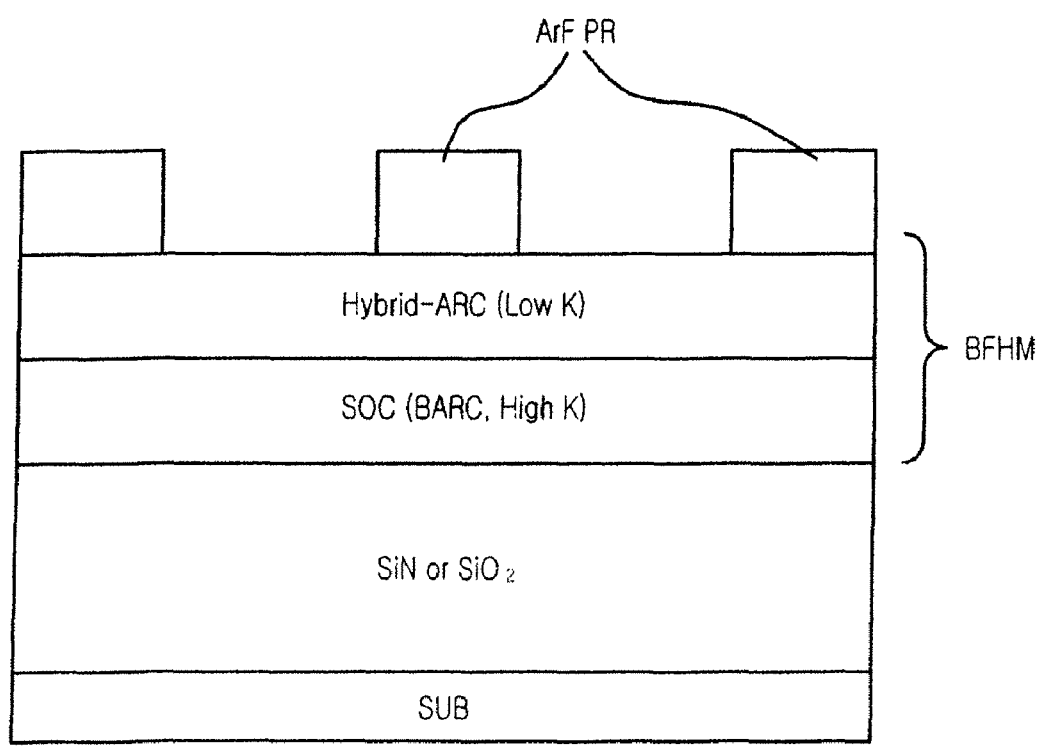

As illustrated in FIGS. 12 and 13, the BFHM is formed in a stack structure including a spin on coating (SOC) layer and a hybrid anti-reflective coating (ARC) layer. The SOC layer may include a bottom anti-reflective coating (BARC) layer and a high-K dielectric layer. The hybrid ARC layer may include a low-K dielectric layer. The TFHM has a stack structure including triple hybrid ARC layers.

Figure 14A:
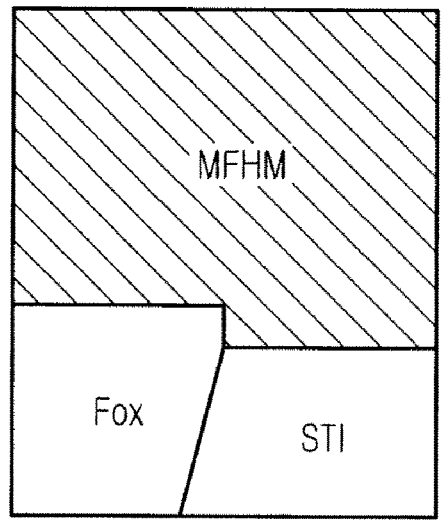
FIGS. 14A to 14C illustrate cross-sectional views of various hard mask structures in accordance with another embodiment of the present invention.
Figure 14B:
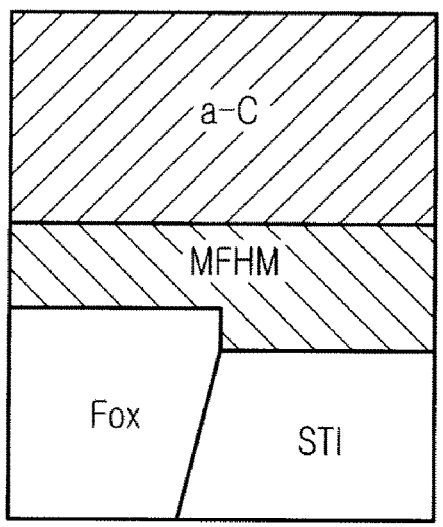
Figure 14C:
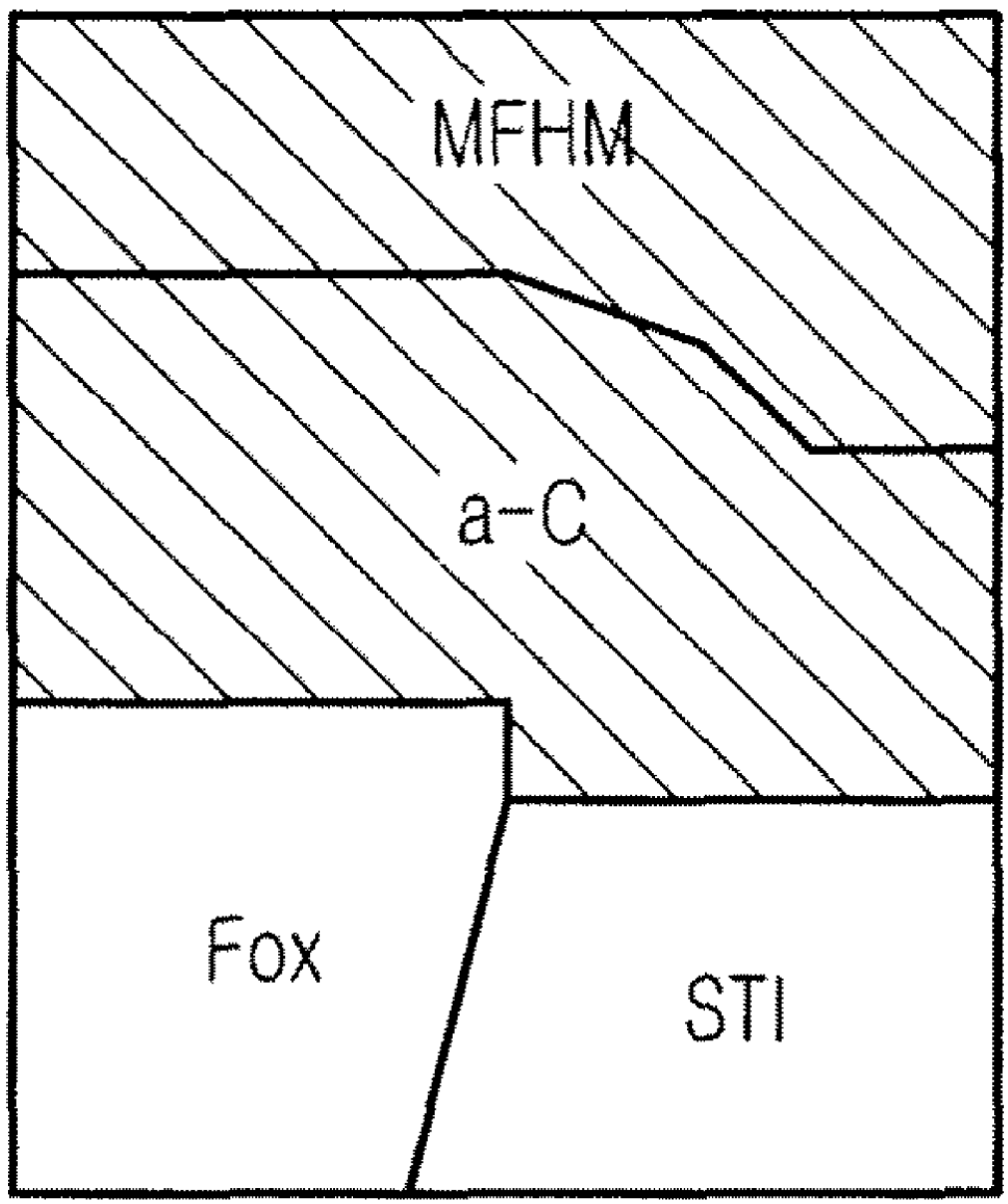

As illustrated in FIGS. 14A to 14C, a hard mask pattern can be formed in a single layer of MFHM or in a stack structure including an amorphous carbon layer a-C and an MFHM layer. The hard mask pattern is formed in the stack structure to obtain a desired level of etch selectivity to the bottom structure when the MFHM layer alone cannot provide a sufficient level of etch selectivity. In such a case, the amorphous carbon layer may cause a height difference, and thus, the amorphous carbon layer is formed thinly.

The saddle type fin transistor according to the embodied fabrication method can be obtained using substantially the same processes as the typical method illustrated in FIGS. 7A to 7F, except for the hard mask including the MFHM layer 212A illustrated in FIG. 11. Thus, detailed description thereof will be omitted for simplicity.

According to the embodiments of the present invention, the fin etching process is performed using a coating material that can be easily planarized. Thus, a FICD of a target structure (i.e., the saddle type fin or gate) is less likely to increase, and as a result, a short circuit effect or leakage current may not be induced during subsequent processes. Accordingly, a device characteristic can be improved.

The present application contains subject matter related to the Korean patent application No. KR 2005-133846, filed in the Korean Patent Office on Dec. 29, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a saddle type fin transistor, comprising:
    preparing a substrate where a device isolation structure is already formed;
    forming a hard mask pattern having a stack structure over the substrate, the hard mask pattern including an amorphous carbon layer and a coating layer, and the amorphous carbon layer is formed over the coating layer; and
    performing an etching process using the hard mask pattern as an etch mask to form a saddle type fin,
    wherein the coating layer is formed with an even height even though a bottom structure has different heights depending on a position, and the coating layer includes at least one layer obtained through a spin on coating method.

2. The method of claim 1, wherein the coating layer further includes an anti-reflective coating layer formed over the at least one layer.

3. The method of claim 2, wherein the coating layer is formed to a height larger than a height difference created beneath the hard mask pattern.

4. The method of claim 3, wherein the forming of the hard mask pattern further comprises:
    forming a silicon oxynitride (SiON) layer over the hard mask pattern;
    coating an anti-reflective coating layer over the SiON layer;
    forming a photoresist pattern over the anti-reflective coating layer; and
    performing a photolithography process on the photoresist pattern to sequentially etch the anti-reflective coating layer, the SiON layer and the hard mask pattern.

5. The method of claim 1, wherein the coating layer includes a spin on coating layer.

6. The method of claim 5, wherein the spin on coating layer includes a bottom anti-reflective coating (BARC) layer and a high-K dielectric layer.

7. The method of claim 1, wherein the coating layer includes a hybrid anti-reflective coating layer.

8. The method of claim 7, wherein the hybrid anti-reflective coating layer includes a low-K dielectric layer.

* * * * *